US009685369B2

(12) United States Patent
Liu et al.

(10) Patent No.: US 9,685,369 B2
(45) Date of Patent: Jun. 20, 2017

(54) CONTACT ETCH STOP LAYERS OF A FIELD EFFECT TRANSISTOR

(71) Applicant: Taiwan Semiconductor Manufacturing Company, Ltd., Hsin-Chu (TW)

(72) Inventors: Chi-Wen Liu, Hsin-Chu (TW); Chao-Hsiung Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/080,087

(22) Filed: Mar. 24, 2016

(65) Prior Publication Data
US 2016/0204026 A1    Jul. 14, 2016

Related U.S. Application Data

(62) Division of application No. 14/186,883, filed on Feb. 21, 2014, now Pat. No. 9,312,354.

(51) Int. Cl.
| H01L 21/336 | (2006.01) |
| H01L 29/66 | (2006.01) |
| H01L 21/768 | (2006.01) |
| H01L 29/78 | (2006.01) |
| H01L 21/265 | (2006.01) |

(52) U.S. Cl.
CPC .. *H01L 21/76834* (2013.01); *H01L 21/76816* (2013.01); *H01L 21/76897* (2013.01); *H01L 29/7833* (2013.01); H01L 21/26513 (2013.01); H01L 29/6659 (2013.01)

(58) Field of Classification Search
CPC ............................ H01L 29/808; H01L 29/7839
USPC ......... 438/283, 195, 176, 157; 257/343, 365
See application file for complete search history.

(56) References Cited

U.S. PATENT DOCUMENTS

| 6,566,718 | B2 | 5/2003 | Wieczorek et al. |
| 7,737,510 | B2 * | 6/2010 | Akamatsu ......... H01L 21/76825 |
| | | | 257/369 |
| 7,759,262 | B2 | 7/2010 | King et al. |
| 7,799,678 | B2 | 9/2010 | Kropewnicki et al. |
| 8,202,776 | B2 | 6/2012 | Chang et al. |
| 8,450,216 | B2 * | 5/2013 | Teo ................... H01L 21/28518 |
| | | | 438/740 |
| 8,497,169 | B2 | 7/2013 | Chang et al. |

(Continued)

FOREIGN PATENT DOCUMENTS

CN             101872742 A        10/2010

*Primary Examiner* — Calvin Lee
(74) *Attorney, Agent, or Firm* — Slater Matsil, LLP

(57) ABSTRACT

A representative method for fabricating a field effect transistor comprises forming a source region and a drain region disposed in a substrate; forming a gate structure over the substrate, the gate structure comprising sidewalls and a top surface, the gate structure interposing the source region and the drain region; forming a contact etch stop layer (CESL) over at least a portion of the top surface of the gate structure; forming an interlayer dielectric layer over the CESL; forming a gate contact extending through the interlayer dielectric layer; and forming a source contact and a drain contact extending through the interlayer dielectric layer, wherein a first distance between an edge of the source contact and a first corresponding edge of the CESL is about 1 nm to about 10 nm.

25 Claims, 11 Drawing Sheets

(56) References Cited

U.S. PATENT DOCUMENTS

| | | |
|---|---|---|
| 8,648,446 B2 | 2/2014 | Chang et al. |
| 9,312,354 B2 * | 4/2016 | Liu .................. H01L 29/49 257/343 |
| 2002/0024119 A1 | 2/2002 | Tanaka et al. |
| 2006/0141766 A1 | 6/2006 | Kim |
| 2008/0157208 A1 | 7/2008 | Fischer et al. |
| 2010/0164002 A1 | 7/2010 | Golonzka et al. |
| 2010/0244247 A1 | 9/2010 | Chang et al. |
| 2012/0032238 A1 | 2/2012 | Teo et al. |

* cited by examiner

CONTACT ETCH STOP LAYERS OF A FIELD EFFECT TRANSISTOR

PRIORITY CLAIM AND CROSS-REFERENCE

This application claims the benefit of U.S. patent application Ser. No. 14/186,883 filed on 21 Feb. 2014, now U.S. Pat. No. 9,312,354 issued 12 Apr. 2016, entitled "Contact Etch Stop Layers of a Field Effect Transistor," which application is incorporated herein by reference.

TECHNICAL FIELD

The disclosure relates to integrated circuit fabrication, and more particularly to a field effect transistor with contact etch stop layers.

BACKGROUND

As the technology nodes shrink, in some integrated circuit (IC) designs, there has been a desire to replace the typically polysilicon gate electrode with a metal gate electrode to improve device performance with the decreased feature sizes. One process of forming a metal gate structure is termed a "gate last" process in which the final gate structure is fabricated "last" which allows for reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high-dielectric-constant (high-k) gate dielectric layers are also used which allow greater physical thicknesses while maintaining the same effective thickness as would be provided by a thinner layer of the gate oxide used in larger technology nodes.

However, there are challenges to implementing such features and processes in complementary metal-oxide-semiconductor (CMOS) fabrication. As the gate length and spacing between devices decrease, these problems are exacerbated. For example, source/drain regions may short to metal gate structures due to misalignment of contacts.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features in the drawings may be arbitrarily increased or reduced for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure provides examples based on a "gate last" metal gate structure, however, one skilled in the art may recognize applicability to other structures and/or use of other materials.

Figure 1:
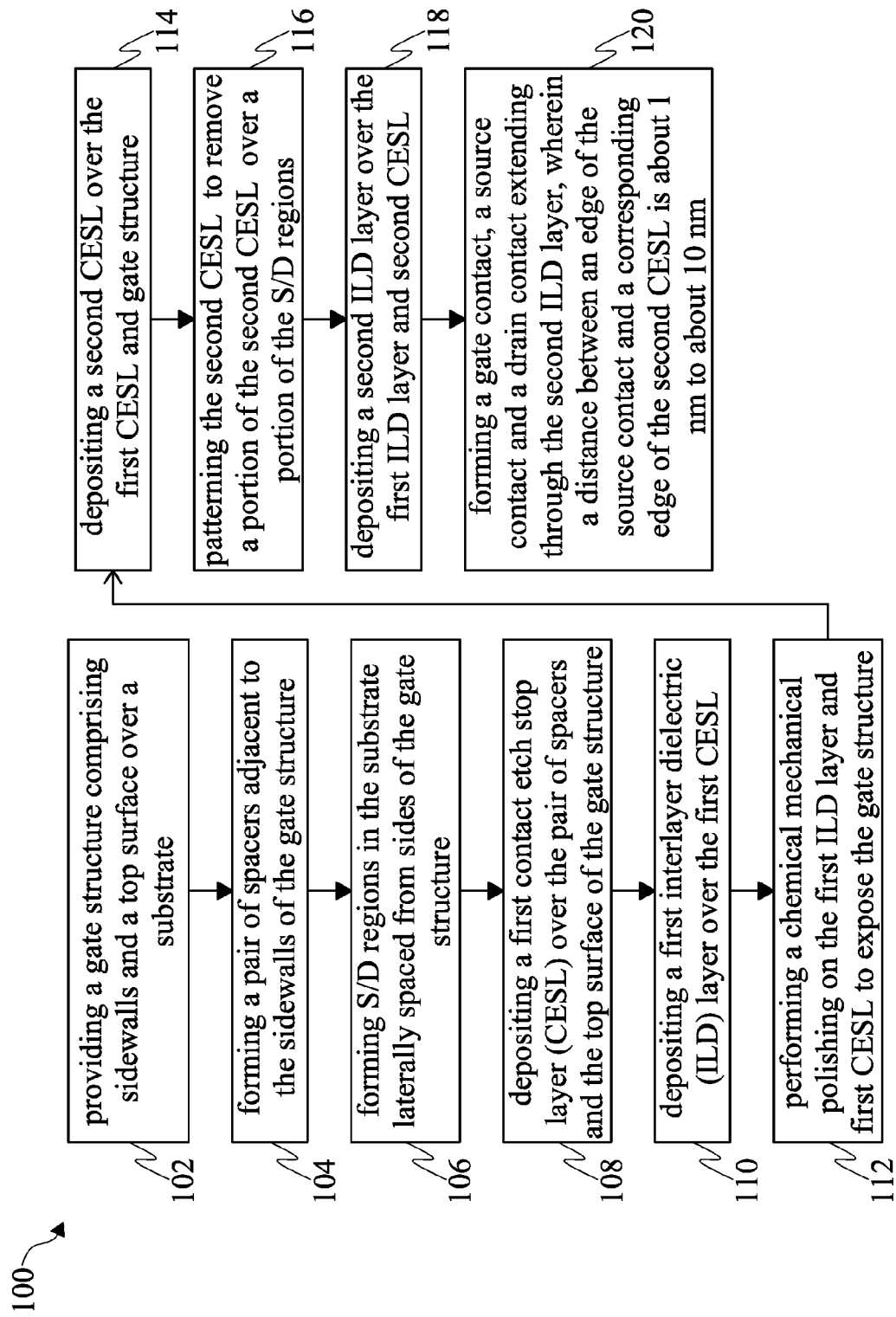
FIG. 1 is a flowchart illustrating a method for fabricating a field effect transistor comprising contact etch stop layers according to various aspects of the present disclosure.

FIG. 1 is a flowchart illustrating a method 100 for fabricating a field effect transistor 200 comprising contact etch stop layers 224, 234 (shown in FIGS. 2C through 2J) according to various aspects of the present disclosure. FIGS. 2A-2J show schematic cross-sectional views of contact etch stop layers 224, 234 of a field effect transistor 200 at various stages of fabrication according to various aspects of the present disclosure. As employed in the present disclosure, the term field effect transistor 200 refers to a fin field effect transistor (FinFET) 200. The FinFET 200 refers to any fin-based, multi-gate transistor. In some embodiments, the term field effect transistor 200 refers to a planar metal-oxide-semiconductor field effect transistor (MOSFET). Other transistor structures and analogous structures, such as gate-all-around (GAA) field effect transistor or tunneling field effect transistor (TFET), are within the contemplated scope of the disclosure. The field effect transistor 200 may be included in a microprocessor, memory cell, and/or other integrated circuit (IC).

The field effect transistor of FIG. 1 may be further processed using CMOS technology processing. Accordingly, it is understood that additional processes may be provided before, during, and after the method 100 of FIG. 1, and that some other processes may only be briefly described herein. Also, FIGS. 1 through 2J are simplified for a better understanding of the concepts of the present disclosure. For example, although the figures illustrate the contact etch stop layers 224, 234 of a field effect transistor 200, it is understood the field effect transistor 200 may be part of an IC that further comprises a number of other devices such as resistors, capacitors, inductors, fuses, etc.

Figure 2A:
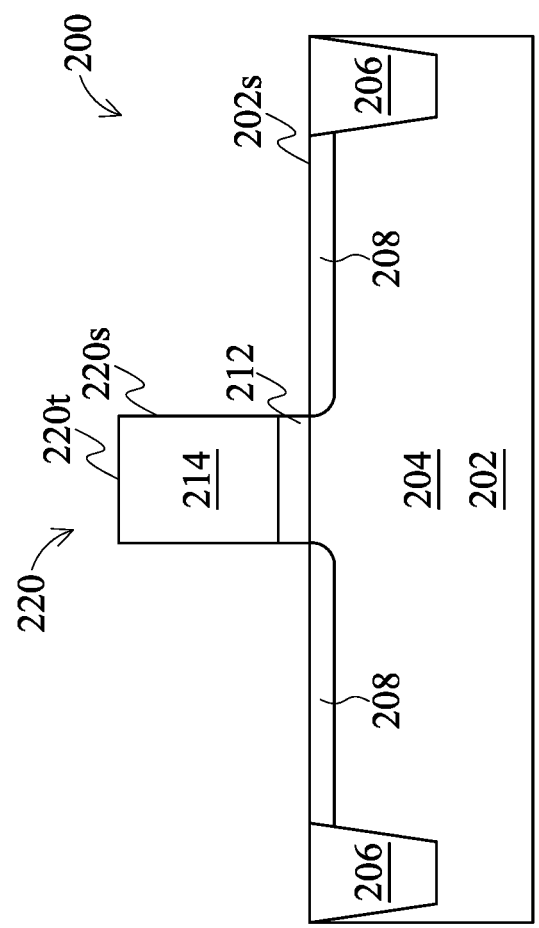
FIGS. 2A-2J show schematic cross-sectional views of contact etch stop layers of a field effect transistor at various stages of fabrication according to various aspects of the present disclosure.

Referring to FIGS. 1 and 2A, the method 100 begins at step 102 wherein a gate structure 220 comprising sidewalls 220s and a top surface 220t over a substrate 202 is provided. In at least one embodiment, the substrate 202 may comprise a silicon substrate. In some alternative embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. The substrate 202 may further comprise other features such as various doped regions, a buried layer, and/or an epitaxy layer. Furthermore, the substrate 202 may be a semiconductor on insulator such as silicon on insulator (SOI) or silicon on sapphire. In some other embodiments, the substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate 202 may comprise a multilayer silicon structure or a silicon substrate may include a multilayer compound semiconductor structure. The substrate 202 comprises a surface 202s.

In some embodiments, the substrate 202 may further comprise active regions 204 and isolation regions 206. The active regions 204 may include various doping configurations depending on design requirements as known in the art. In some embodiments, the active region 204 may be doped with p-type or n-type dopants. For example, the active regions 204 may be doped with p-type dopants, such as boron or BF2; n-type dopants, such as phosphorus or arsenic; and/or combinations thereof. The active regions 204 may be configured for an N-type metal-oxide-semiconductor field effect transistor (referred to as an NMOSFET), or alternatively configured for a P-type metal-oxide-semiconductor field effect transistor (referred to as a PMOSFET).

In some embodiments, the isolation regions 206 may be formed on the substrate 202 to isolate the various active regions 204. The isolation regions 206 may utilize isolation technology, such as local oxidation of silicon (LOCOS) or shallow trench isolation (STI), to define and electrically isolate the various active regions 204. In at least one embodiment, the isolation region 206 includes a STI. The isolation regions 206 may comprise silicon oxide, silicon nitride, silicon oxynitride, fluoride-doped silicate glass (FSG), a low-K dielectric material, other suitable materials, and/or combinations thereof. The isolation regions 206, and in the present embodiment, the STI, may be formed by any suitable process. As one example, the formation of the STI may include patterning the semiconductor substrate 202 by a conventional photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Then, a gate dielectric layer 212 is formed over the substrate 202. In some embodiments, the gate dielectric layer 212 may comprise silicon oxide, silicon oxynitride, or high-k dielectric material. A high-k dielectric material is defined as a dielectric material with a dielectric constant greater than that of SiO2. The high-k dielectric material comprises metal oxide. In some embodiments, the metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or mixtures thereof. The gate dielectric layer 212 may be grown by a thermal oxidation process, a chemical vapor deposition (CVD) process, an atomic layer deposition (ALD) process, and may have a thickness less than 2 nm.

In some embodiments, the gate dielectric layer 212 may further comprise an interfacial layer (not shown) to minimize stress between the gate dielectric layer 212 and the substrate 202. The interfacial layer may be formed of silicon oxide or silicon oxynitride grown by a thermal oxidation process. For example, the interfacial layer can be grown by a rapid thermal oxidation (RTO) process or in an annealing process comprising oxygen.

Then, a dummy gate electrode layer 214 may be formed over the gate dielectric layer 212. In some embodiments, the dummy gate electrode layer 214 may comprise a single layer or multilayer structure. In the present embodiment, the dummy gate electrode layer 214 may comprise poly-silicon. Further, the dummy gate electrode layer 214 may be doped poly-silicon with the uniform or gradient doping. The dummy gate electrode layer 214 may have any suitable thickness. In the present embodiment, the dummy gate electrode layer 214 has a thickness in the range of about 30 nm to about 60 nm. In some embodiments, the dummy gate electrode layer 214 may be formed using a low-pressure chemical vapor deposition (LPCVD) process. In at least one embodiment, the LPCVD process can be carried out in a LPCVD furnace at a temperature of about 580° C. to 650° C. and at a pressure of about 200 mTorr to 1 Torr, using silane ($SiH_4$), disilane ($Si_2H_6$), trisilane ($Si_3H_8$) or dichlorosilane ($SiH_2Cl_2$) as the silicon source gas.

And then, in some embodiments, a hard mask layer (not shown) may be formed over the dummy gate electrode layer 214 to protect the dummy gate electrode layer 214. The hard mask layer may include silicon nitride. The hard mask layer can be deposited by, for example, a CVD process, or a LPCVD process. The hard mask layer may have a thickness of about 100 to 400 Å. After the hard mask layer is deposited, the hard mask layer is patterned using a photosensitive layer (not shown). Then the gate structure 220 is patterned through the hard mask layer using a reactive ion etching (RIE) or a high density plasma (HDP) process, exposing a portion of the substrate 202, thereby the gate structure 220 comprises sidewalls 220s and a top surface 220t.

Also shown in FIG. 2A, in some embodiments, after formation of the gate structure 220, lightly doped source and drain (LDD) regions 208 may be created in the active region 204. This is accomplished via ion implantation of boron or phosphorous, at an energy between about 5 to 100 KeV, at a dose between about 1E11 to 1E14 atoms/cm².

Figure 2B:
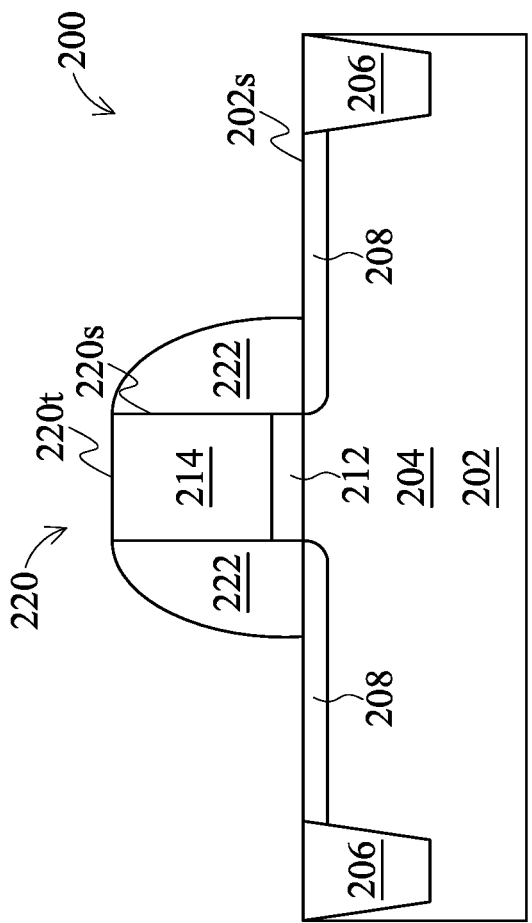

Referring to FIGS. 1 and 2B, the method 100 continues with step 104 in which a pair of spacers 222 adjacent to the sidewalls 220s of the gate structure 220 is formed. The pair of spacers 222 may be formed of silicon oxide, silicon nitride, silicon oxynitride, silicon carbide, fluoride-doped silicate glass (FSG), a low k dielectric material, and/or combinations thereof. The pair of spacers 222 may have a multiple-layers structure, for example, including one or more liner layers. The liner layer may include a dielectric material such as silicon oxide, silicon nitride, and/or other suitable materials. The pair of spacers 222 may be formed by methods including deposition of suitable dielectric material and anisotropically etching the material to form the pair of spacers 222. A width of one of the pair of the spacers 222 may be in the range of about 6 to 35 nm.

Figure 2C:
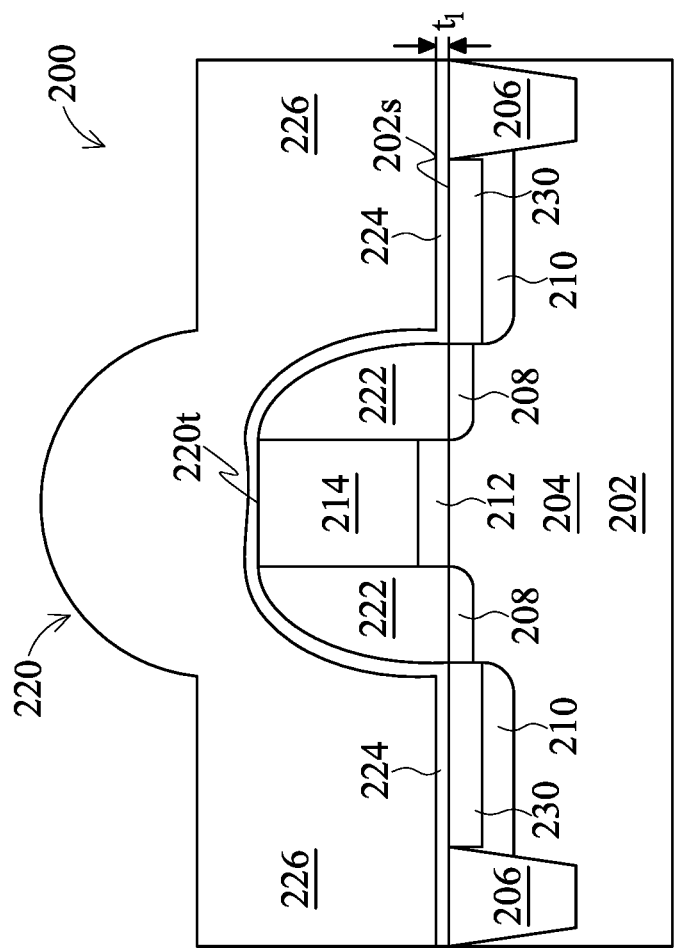

Referring to FIGS. 1 and 2C, the method 100 continues with step 106 in which source/drain (S/D) regions 210 in the substrate 202 laterally spaced from sides of the gate structure 220 (i.e. adjacent the region of the substrate 202 underlying the gate structure) are formed. In some embodiments, a plurality of heavily doped S/D regions 210 in the active region 204 is needed for low resistance contact. This is achieved via ion implantation of boron or phosphorous, at an energy level between about 5 to 150 KeV, at a dose between about 1E15 to 1E16 atoms/cm².

In some embodiments, silicide regions 230 may be optionally formed on the S/D regions 210 by a self-aligned silicide (salicide) process. For example, the salicide process may comprise 2 steps. First, a metal material may be deposited via sputtering to the substrate surface 202s at a temperature between 500° C. to 900° C., causing a reaction between the underlying silicon and metal material to form the silicide regions 230. And then, the un-reacted metal material may be etched away. The silicide regions 230 may comprise a material selected from titanium silicide, cobalt silicide, nickel silicide, platinum silicide, erbium silicide, or palladium silicide. A thickness of the silicide regions 230 is in the range of about 30 to 50 nm. In some embodiments, germanide regions 230 may be optionally formed on the S/D regions 210 by a self-aligned germanide process if the substrate 202 comprises Ge. In some embodiments, the germanide regions 230 may comprise NiGe, PtGe, $TiGe_2$, $CoGe_2$, or PdGe.

The method 100 in FIG. 1 continues with step 108 in which the structure in FIG. 2C is produced by depositing a first contact etch stop layer (CESL) 224 over the pair of spacers 222 and the top surface 220t of the gate structure 220 and extending along the surface 202s of the substrate 202. The first CESL 224 may comprise, but is not limited to, silicon nitride or carbon-doped silicon nitride. The first CESL 224 may have any suitable thickness. In some embodiments, the first CESL 224 has a thickness t1 in the range of about 180 angstroms to about 220 angstroms.

In some embodiments, the first CESL 224 may be deposited using CVD, high density plasma (HDP) CVD, sub-atmospheric CVD (SACVD), molecular layer deposition (MLD), sputtering, or other suitable methods. For example, in some embodiments, the MLD process is generally carried out under a pressure less than 10 mTorr and in the temperature range from about 350° C. to about 500° C. In at least one embodiment, the silicon nitride is deposited on the pair of spacers 222 and the top surface 220t of the gate structure 220 by reacting a silicon source compound and a nitrogen source. The silicon source compound provides silicon to the deposited silicon nitride and may be silane ($SiH_4$) or tetrathoxysilane (TEOS). The nitrogen source provides nitrogen to the deposited silicon nitride and may be ammonia ($NH_3$) or nitrogen gas ($N_2$). In another embodiment, the carbon-doped silicon nitride is deposited on the pair of spacers 222 and the top surface 220t of the gate structure 220 by reacting a carbon source compound, a silicon source compound, and a nitrogen source. The carbon source compound may be an organic compound, such as a hydrocarbon compound, e.g., ethylene ($C_2H_6$).

The method 100 in FIG. 1 continues with step 110 in which the structure in FIG. 2C is produced by further depositing a first interlayer dielectric (ILD) layer 226 over the first CESL 224. The first ILD layer 226 may comprise a dielectric material. The dielectric material may comprise silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), polyimide, and/or combinations thereof. It is understood that the first ILD layer 226 may comprise one or more dielectric materials and/or one or more dielectric layers. In some embodiments, the first ILD layer 226 may be deposited over the first CESL 224 to a suitable thickness by CVD, high density plasma (HDP) CVD, sub-atmospheric CVD (SACVD), spin-on, sputtering, or other suitable methods. In the present embodiment, the first ILD layer 226 comprises a thickness of about 3000 to 4500 Å.

Figure 2D:
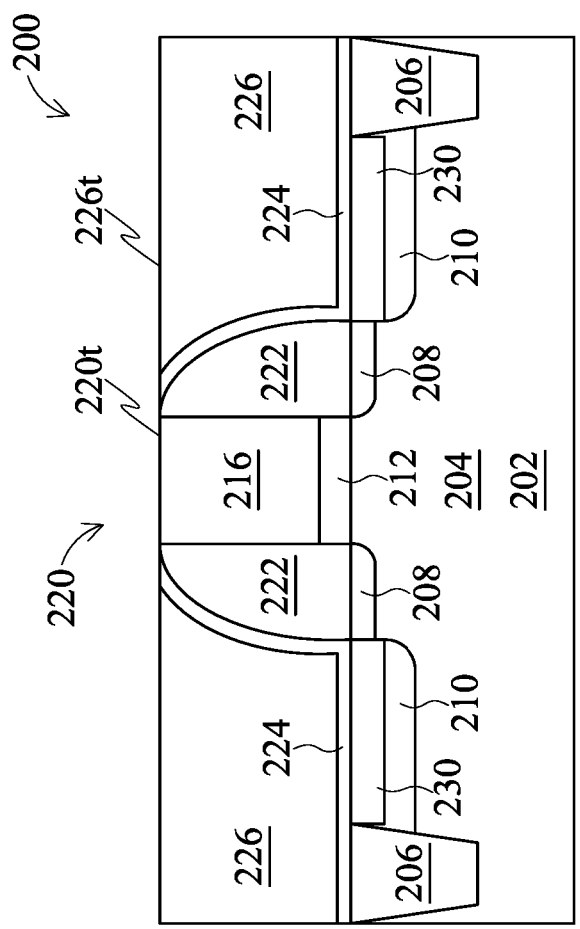

The method 100 in FIG. 1 continues with step 112 in which the structure in FIG. 2D is produced by performing a chemical mechanical polishing (CMP) on the first ILD layer 226 and first CESL 224 to expose the top surface 220t of the gate structure 220. In a gate last process, the dummy gate electrode layer 214 may be removed so that a resulting metal gate electrode layer 216 may be formed in place of the dummy gate electrode layer 214. Accordingly, the first ILD layer 226 is planarized using a CMP process until the top surface 220t of the dummy gate electrode layer 214 is exposed or reached. The CMP process may have a high selectivity to provide a substantially planar surface for the dummy gate electrode layer 214, the pair of spacers 222, first CESL 224, and first ILD layer 226. Thus, a top surface 226t of the first ILD layer 226 is coplanar with the top surface 220t of the gate structure 220. The CMP process may also have low dishing and/or erosion effect. In some alternative embodiments, the CMP process may be performed to expose the hard mask layer and then an etching process such as a wet etch dip may be applied to remove the hard mask layer thereby exposing the top surface 220t of the dummy gate electrode layer 214.

After the CMP process, a gate replacement process is performed. The dummy gate electrode layer 214 may be removed from the gate structure 220 surrounded with dielectric comprising the pair of spacers 222, first CESL 224, and first ILD layer 226. The dummy gate electrode layer 214 may be removed to form a trench in the gate structure 220 by any suitable process, including the processes described herein. In some embodiments, the dummy gate electrode layer 214 may be removed using a wet etch and/or a dry etch process. In at least one embodiment, the wet etch process for the dummy poly-silicon gate electrode layer 214 comprises exposure to a hydroxide containing solution (e.g., ammonium hydroxide), deionized water, and/or other suitable etchant solutions.

When the dummy gate electrode layer 214 is removed, this results in the formation of a trench (not shown). A metal layer may be formed to fill in the trench. The metal layer may include any metal material suitable for forming a metal gate electrode layer 216 or portion thereof, including barriers, work function layers, liner layers, interface layers, seed layers, adhesion layers, barrier layers, etc. In some embodiments, the metal layer may include suitable metals, such as TiN, WN, TaN, or Ru that properly perform in the PMOSFET. In some alternative embodiments, the metal layer may include suitable metals, such as Ti, Ag, Al, TiAl, TiAlN, TiAlC, TiAlCN, TaC, TaCN, TaSiN, Mn, or Zr that properly perform in the NMOSFET. Another CMP is performed on the metal layer to form the metal gate electrode layer 216 of the field effect transistor 200. For simplicity and clarity, the metal gate electrode layer 216 and gate dielectric layer 212 are combined and hereinafter also referred to as a gate structure 220.

Figure 2E:
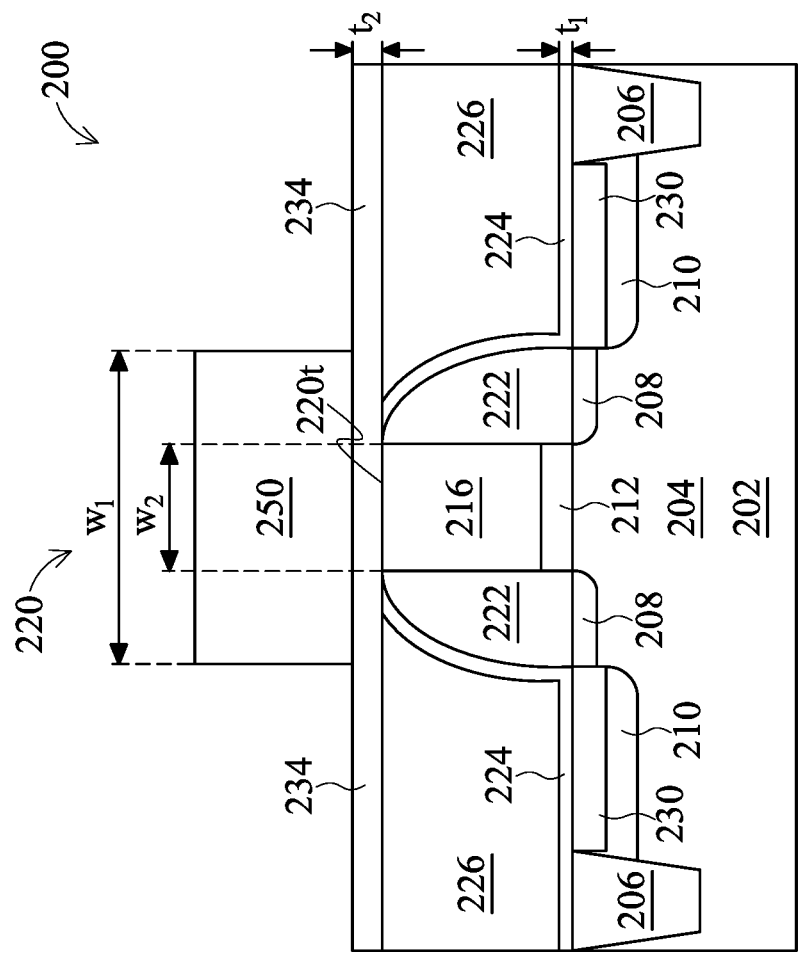

In some embodiments, it is desirable to protect the metal gate structure 220 from being damaged during contact etching. The method 100 in FIG. 1 continues with step 114 in which the structure in FIG. 2E is produced by depositing a second contact etch stop layer (CESL) 234 over the first CESL 224, the first ILD layer 226 and the gate structure 220. The second CESL 234 will protect the gate structure 220 during contact etching. In some embodiments, the second CESL 234 may comprise a dielectric material, such as silicon nitride or carbon-doped silicon nitride. In some embodiments, the second CESL 234 may comprise a conductive material, such as Ti, TiN, TiC, TiCN, Ta, TaN, TaC, TaCN, W, WN, WC, WCN, TiAl, TiAlN, TiAlC, or TiAlCN.

The second CESL 234 may have any suitable thickness. In the present embodiment, the second CESL 234 has a thickness t2 in the range of about 190 angstroms to about 250 angstroms. In at least one embodiment, the thickness t1 of the first CESL 224 is less than the thickness t2 of the second CESL 234. In some embodiments, a ratio of the thickness t2 of the second CESL 234 to the thickness t1 of the first CESL 224 is from 1.05 to 1.15. In some other embodiment, a thickness t1 of the first CESL 224 may be greater than a thickness t2 of the second CESL 234 for capacitance reduction if some metal gate electrode layer 216 loss is acceptable.

In some embodiments, the second contact etch stop layer 234 may be deposited using CVD, high density plasma (HDP) CVD, sub-atmospheric CVD (SACVD), molecular layer deposition (MLD), sputtering, physical vapor deposition (PVD), plating, or other suitable methods. For example, in at least one embodiment, the MLD process is generally carried out under a pressure less than 10 mTorr and in the temperature range from about 350° C. to about 500° C. In some embodiments, the silicon nitride is deposited on the ILD layer 226 and the top surface 220t of the gate structure 220 by reacting a silicon source compound and a nitrogen source. The silicon source compound provides silicon to the deposited silicon nitride and may be silane ($SiH_4$) or tetrathoxysilane (TEOS). The nitrogen source provides nitrogen to the deposited silicon nitride and may be ammonia ($NH_3$) or nitrogen gas ($N_2$). In some other embodiments, the carbon-doped silicon nitride is deposited on the ILD layer 226 and the top surface 220t of the gate structure 220 by reacting a carbon source compound, a silicon source compound, and a nitrogen source. The carbon source compound may be an organic compound, such as a hydrocarbon compound, e.g., ethylene ($C_2H_6$).

In the present embodiment, the first and second CESLs 224, 234 comprise the same material. In some alternative embodiments, the first and second CESLs 224, 234 comprise different materials. For example, in some embodiments, the first CESL 224 is silicon nitride, the second CESL 234 is carbon-doped silicon nitride, and vice versa. In some embodiments, the first CESL 224 is silicon nitride, the second CESL is TiN.

Then, a patterned photo-sensitive layer 250 is formed on the second contact etch stop layer 234. For example, the patterned photo-sensitive layer 250 may be formed using processes such as, spin-coating, photolithography processes including exposure, bake, and development processes, etching (including ashing or stripping processes), and/or other processes. The patterned photo-sensitive layer 250 is sensitive to particular exposure beam such KrF, ArF, EUV or e-beam light. In at least one example, the patterned photo-sensitive layer includes polymers, quencher, chromophore, solvent and/or chemical amplifier (CA). In the present embodiment, the patterned photo-sensitive layer 250 exposes a portion of the second CESL 234 not over the gate structure 220 for contact formation in the S/D regions 210. The width W1 of photo-sensitive layer 250 is greater than or equal to a width W2 of the gate structure 220.

Figure 2F:
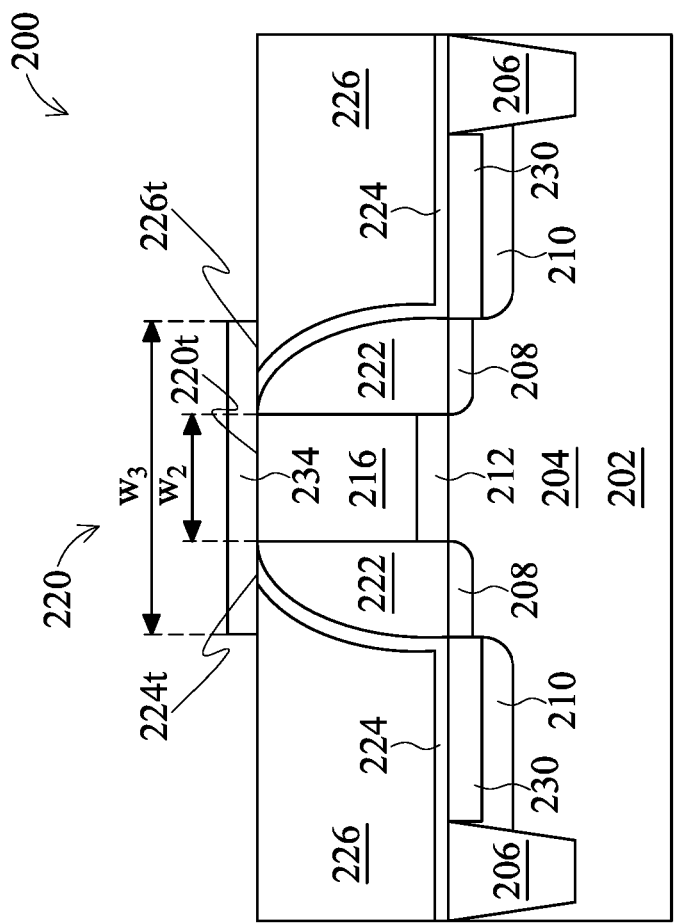

The method 100 in FIG. 1 continues with step 116 in which the structure in FIG. 2F is produced by patterning the second CESL 234 to remove a portion of the second CESL 234 over a portion of the S/D regions 210, whereby the second CESL 234 remains over at least a portion of the top surface 220t of the gate structure 220. In some embodiments, the second CESL 234 is patterned through the photo-sensitive layer 250 using a dry etching process, exposing a portion of the ILD layer 226, thereby a width W3 of second CESL 234 is greater than or equal to the width W2 of the gate structure 220. The dry etching process may have a high selectivity such that the dry etching process may stop at the ILD layer 226. For example, the dry etching process may be performed under a source power of about 150 W to about 220 W, and a pressure of about 10 mTorr to about 45 mTorr, using $CH_2F_2$ and Ar as etching gases.

In the present embodiment, the second CESL 234 comprises a portion extending on the top surface 220t of the gate structure 220. The second CESL 234 in some embodiments further comprises a portion extending on a top surface 224t of the first CESL 224. The second CESL 234 in some embodiments further comprises a portion extending on the top surface 226t of the ILD layer 226.

Figure 2G:
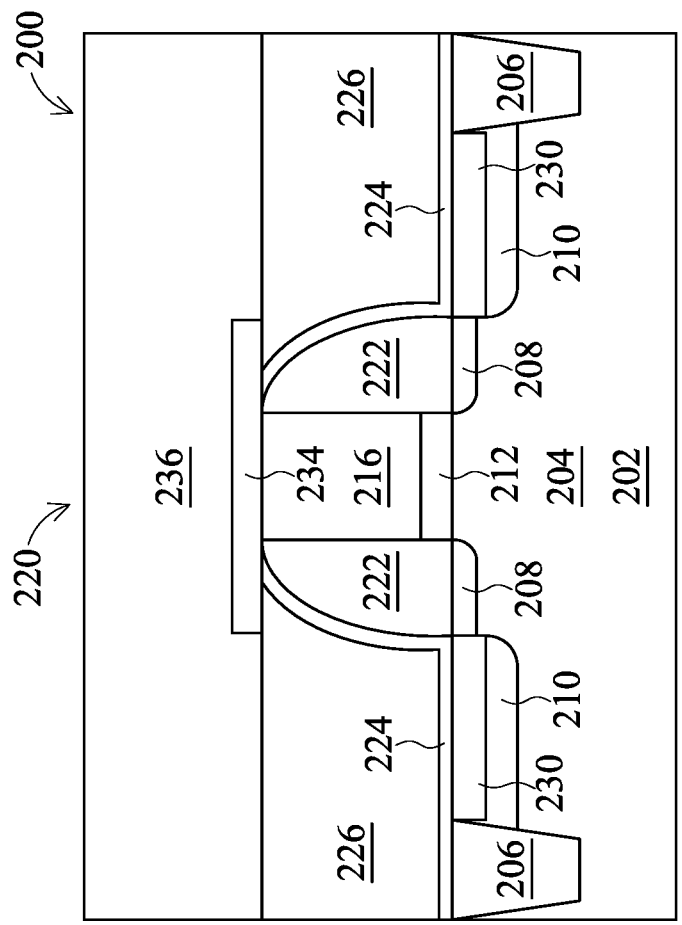

The method 100 in FIG. 1 continues with step 118 in which the structure in FIG. 2G is produced by depositing a second interlayer dielectric (ILD) layer 236 over the first ILD layer 226 and second CESL 234. In the present embodiment, the second ILD layer 236 may comprise a dielectric material. The dielectric material may comprise silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), polyimide, and/or combinations thereof. It is understood that the second ILD layer 236 may comprise one or more dielectric materials and/or one or more dielectric layers. In some embodiments, the second ILD layer 236 may be deposited over the first ILD layer 226 and second contact etch stop layers 234 to a suitable thickness by CVD, HDP CVD, SACVD, spin-on, sputtering, or other suitable methods. In the present embodiment, the second ILD layer 236 comprises a thickness of about 3000 to 4500 Å.

Figure 2H:
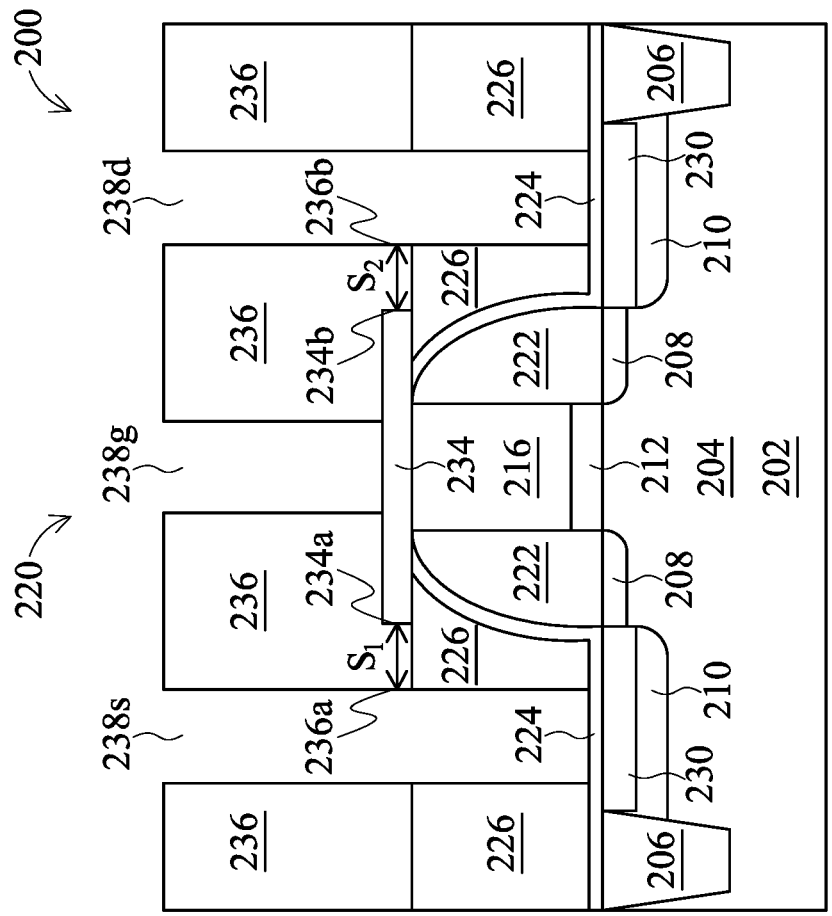
Figure 2I:
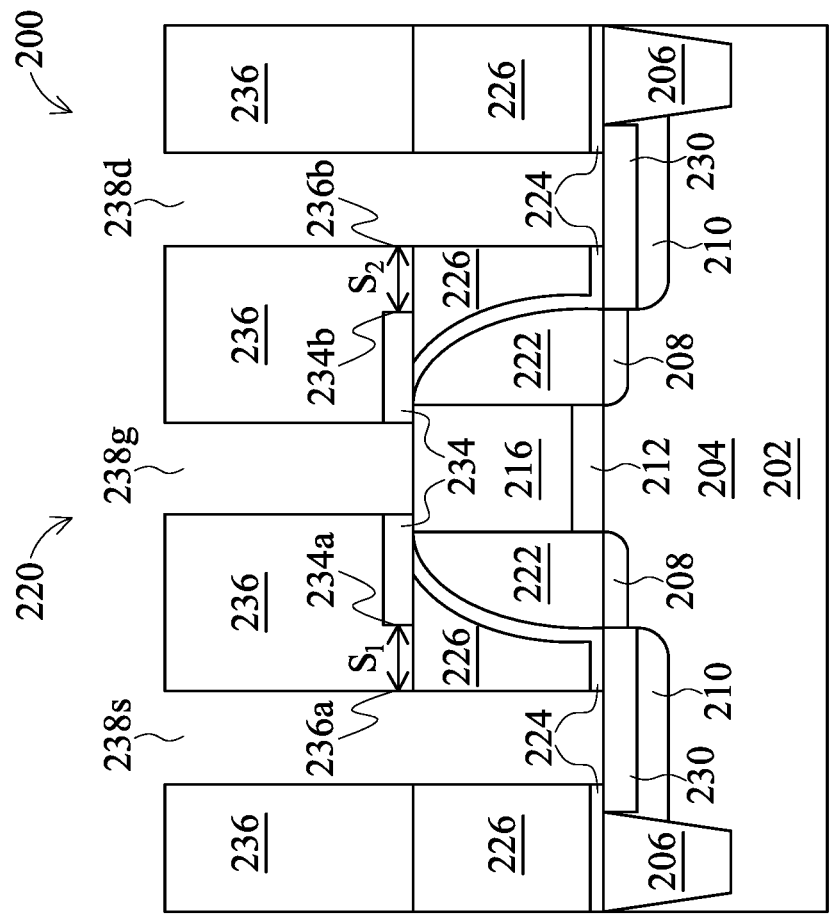
Figure 2J:
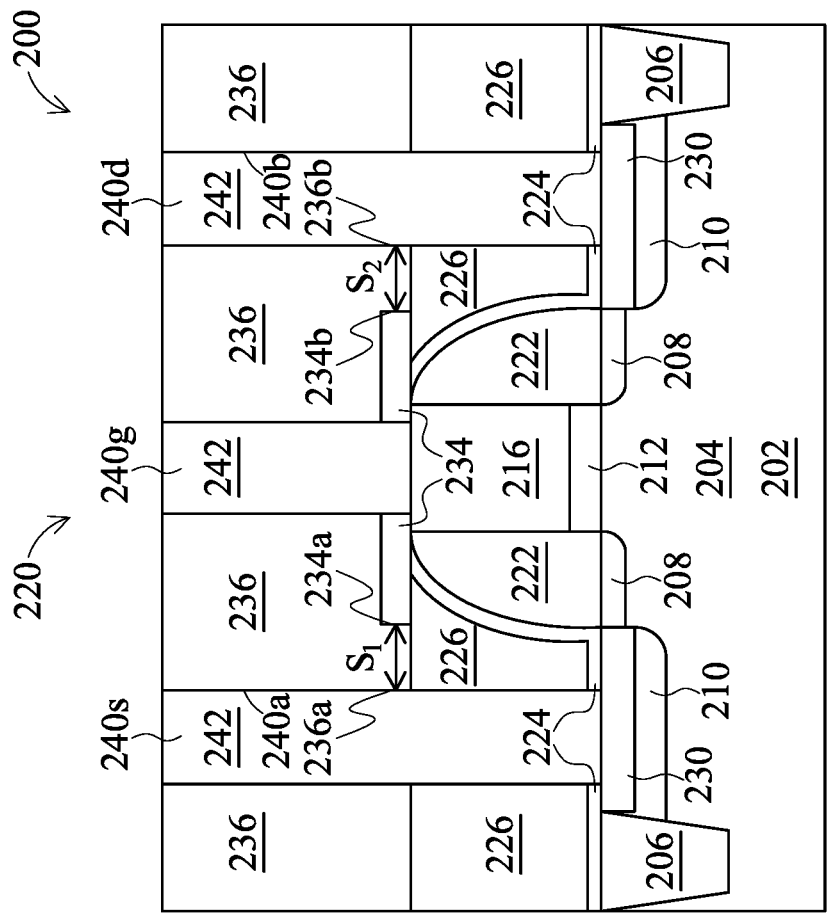

Referring to FIGS. 2H-2J and step 120 in FIG. 1, subsequent CMOS processing steps applied to the field effect transistor 200 may comprise forming a gate contact 240g, a source contact 240s, and a drain contact 240d extending through the first ILD layer 226, second ILD layer 236, first CESL 224, and second CESL 234 to provide electrical contact to the gate structure 220 and/or S/D regions 210. In some embodiments, a first distance S1 between an edge 240a of the source contact 240s and a first corresponding edge 234a of the second CESL 234 is about 1 nm to about 10 nm. In some embodiments, a second distance $S_2$ between an edge 240b of the drain contact 240d and a second corresponding edge 234b of the second CESL 234 is about 1 nm to about 10 nm (shown in FIG. 2J). In some embodiments, the first distance $S_1$ is substantially equal to the second distance $S_2$. In some embodiments, the first distance S1 is different to the second distance $S_2$. In some embodiments, a ratio of the first distance $S_1$ to the second distance $S_2$ is between about 0.5 to about 1.5.

Referring to FIGS. 2H and 2I, contact holes 238 (comprising 238g, 238s, and 238d) may be formed by any suitable process. As one example, the formation of the contact holes 238 may include patterning the second ILD layer 236 by a photolithography process, etching the exposed second ILD layer 236 (for example, by using a dry etching, wet etching, and/or plasma etching process) to remove portions of the second ILD layer 236 over a portion of the S/D region 210 and a portion of the gate structure 220 to expose portions of the first and second CESLs 224, 234 (shown in FIG. 2H).

In some embodiments, it is desirable to prevent the source/drain regions 210 from being contacting the metal gate structure 220 due to misalignment of contacts. Thus, the edges 234a, 234b of the second CESL 234 may not extend as far as up to the metal gate 220. In some embodiments, it is desirable to provide enough space for source/drain contact formation. Thus, the edges 234a, 234b of the second CESL 234 may not extend as far as up to the S/D regions 210. In some embodiments, a first distance (equal to the first distance S1) between an edge 236a of the second ILD layer 236 and the first corresponding edge 234a of the CESL 234 is about 1 nm to about 10 nm. In some embodiments, a second distance (equal to the second distance $S_2$) between an edge 236b of the second ILD layer 236 and the second corresponding edge 234b of the CESL 234 is about 1 nm to about 10 nm.

Referring to FIG. 2I, the exposed portions of the first and second CESLs 224, 234 are removed to expose the gate structure 220 and silicide region 230. In the present embodiment, the first and second CESLs 224, 234 are simultaneously removed using a dry etching process. The dry etching process may have a high selectivity such that the dry etching process may stop at the gate structure 220 and silicide region 230. For example, the dry etching process may be performed under a source power of about 150 to 220 W, and a pressure of about 10 to 45 mTorr, using $CH_2F_2$ and Ar as etching gases. Therefore, unwanted etching of the metal gate structure 220 may be reduced during contact etching due to the introduction of the second CESL 234 over the metal gate structure 220. Accordingly, the disclosed methods of fabricating CESLs 224, 234 of the field effect transistor 200 may fabricate a metal gate structure 220 without a recess caused by the contact etch, thereby enhancing the device performance.

Referring to FIG. 2J, following formation of the contact holes 238, the structure in FIG. 2J is produced by filling a metal layer 242 in the contact holes 238. In some embodiments, the metal layer 242 comprises TiN, TaN, Ta, Ti, Hf, Zr, Ni, W, Co, Cu, or Al. In some embodiments, the metal layer 242 may be formed by CVD, PVD, plating, ALD, or other suitable technique. In some embodiment, the metal layer 242 may comprise a laminate. The laminate may further comprise a barrier metal layer, a linear metal layer or a wetting metal layer. Further, the thickness of the metal layer 242 will depend on the depth of the contact holes 238. The metal layer 242 is thus deposited until the contact holes 238 are substantially filled or over-filled.

Then, another CMP is performed to planarize the metal layer 242 after filling the contact holes 238. Since the CMP removes a portion of the metal layer 242 outside of the contact holes 238, the CMP process may stop when reaching the second ILD layer 236, and thus providing a substantially planar surface. In some embodiments, the gate contact 240g extends through the second CESL 234 and second ILD layer 236. In some embodiments, the source contact 240s and the drain contact 240d extends through the first CESL 224, first ILD layer 226, and second ILD layer 236.

Then, in some embodiments, subsequent processes, including interconnect processing, are performed after forming the field effect transistor 200 to complete the IC fabrication.

In accordance with one embodiment, a field effect transistor comprises a substrate; a source region and a drain region disposed in the substrate; a gate structure over the substrate comprising sidewalls and a top surface, wherein the gate structure interposes the source region and the drain region; a contact etch stop layer (CESL) over at least a portion of the top surface of the gate structure; an interlayer dielectric layer over the CESL; a gate contact extending through the interlayer dielectric layer; and a source contact and a drain contact extending through the interlayer dielectric layer, wherein a first distance between an edge of the source contact and a first corresponding edge of the CESL is about 1 nm to about 10 nm.

In accordance with another embodiment, a field effect transistor comprises a substrate comprising a surface; a source region and a drain region disposed in the substrate; a gate structure over the substrate comprising sidewalls and a top surface, wherein the gate structure interposes the source region and the drain region; a pair of spacers adjacent to the sidewalls of the gate structure; a first contact etch stop layer (CESL) over the pair of spacers and extending along the surface of the substrate; a second CESL over at least a portion of the top surface of the gate structure; an interlayer dielectric layer over the first CESL and the second CESL; a gate contact extending through the interlayer dielectric layer; and a source contact and a drain contact extending through the interlayer dielectric layer and the first CESL, wherein a distance between an edge of the source contact and a corresponding edge of the second CESL is about 1 nm to about 10 nm.

In accordance with another embodiments, a method for fabricating a field effect transistor comprises providing a gate structure comprising sidewalls and a top surface over a substrate; forming a pair of spacers adjacent to the sidewalls of the gate structure; forming source/drain (S/D) regions in the substrate on sides of the gate structure; depositing a first contact etch stop layer (CESL) over the pair of the spacers and the top surface of the gate structure; depositing a first interlayer dielectric (ILD) layer over the first CESL; performing a chemical mechanical polishing on the first ILD layer and first CESL to expose the gate structure; depositing a second CESL over the first CESL and gate structure; patterning the second CESL to remove a portion of the second CESL over a portion of the S/D regions; depositing a second ILD layer over the first ILD layer and second CESL; and forming a gate contact, a source contact and a drain contact extending through the second ILD layer, wherein a distance between an edge of the source contact and a corresponding edge of the second CESL is about 1 nm to about 10 nm.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a field effect transistor, the method comprising:
   forming a gate structure over a substrate, the gate structure comprising sidewalls and a top surface;
   forming spacers adjacent opposing sidewalls of the gate structure;
   forming a first contact etch stop layer (CESL) over the spacers and extending along a surface of the substrate;
   forming a second CESL over at least a portion of the top surface of the gate structure;
   forming an interlayer dielectric layer over the first CESL and the second CESL;
   forming a gate contact extending through the interlayer dielectric layer; and
   forming a source contact and a drain contact extending through the interlayer dielectric layer and the first CESL, wherein there is no silicide region on the substrate, and a distance between an edge of the source contact and a corresponding edge of the second CESL is about 1 nm to about 10 nm.

2. The method of claim 1, wherein a width of the second CESL is greater than or equal to a width of the gate structure.

3. The method of claim 1, wherein forming the second CESL further comprises forming a portion extending on a top surface of the first CESL.

4. The method of claim 1, wherein forming the gate contact further comprises forming a portion of the gate contact that extends through the second CESL.

5. The method of claim 1, wherein a thickness of the first CESL is less than a thickness of the second CESL.

6. The method of claim 1, wherein a ratio of a thickness of the second CESL to a thickness of the first CESL is from about 7.1 to about 8.1.

7. The method of claim 1, wherein the first CESL and second CESLs comprise different materials.

8. The method of claim 1, wherein the first CESL and second CESL comprise a same material.

9. The method of claim 1, further comprising forming a germanide region on the source and drain regions.

10. The method of claim 9, wherein the germanide region comprises one of NiGe, PtGe, $TiGe_2$, $CoGe_2$, or PdGe.

11. A method for fabricating a field effect transistor, the method comprising:
forming a source region and a drain region in a substrate and a gate structure over the substrate, the substrate having a major surface, the gate structure having sidewalls and a top surface, wherein the gate structure interposes the source region and the drain region, and there being no silicide region in the substrate on sides of the gate structure;
forming a contact etch stop layer (CESL) over at least a portion of the top surface of the gate structure, the CESL extending laterally in a direction substantially parallel to the major surface of the substrate;
forming an interlayer dielectric layer over the CESL;
forming a gate contact, the gate contact extending through the interlayer dielectric layer; and
forming a source contact and a drain contact extending through the interlayer dielectric layer, wherein a first edge of the CESL that is proximate the source contact is spaced apart from the source contact by a first distance in a direction substantially parallel to the major surface of the substrate, and a second edge of the CESL that is proximate to the drain contact is spaced apart from the drain contact by a second distance in a direction substantially parallel to the major surface of the substrate, wherein the second distance is about 1 nm to about 10 nm.

12. The method of claim 11, wherein the first distance is substantially equal to the second distance.

13. The method of claim 11, wherein the first distance is different than the second distance.

14. The method of claim 11, wherein a ratio of the first distance to the second distance is between about 0.5 to about 1.5.

15. The method of claim 11, wherein the CESL comprises silicon nitride or carbon-doped silicon nitride.

16. The method of claim 11, wherein the gate contact comprises a portion extending through the CESL.

17. The method of claim 16, wherein a width of the CESL is greater than or equal to the width of the gate structure.

18. The method of claim 11, further comprising forming a germanide region on the source and drain regions.

19. The method of claim 18, wherein the germanide region comprises one of NiGe, PtGe, $TiGe_2$, $CoGe_2$, or PdGe.

20. A method for fabricating a field effect transistor, the method comprising:
forming a gate structure over a substrate, the gate structure comprising sidewalls and a top surface, the substrate comprising a major surface;
forming spacers adjacent opposing sidewalls of the gate structure;
forming source/drain (S/D) regions in the substrate on opposing sides of the gate structure, there being no silicide region in the substrate on sides of the gate structure;
depositing a first contact etch stop layer (CESL) over the spacers and the top surface of the gate structure;
depositing a first interlayer dielectric (ILD) layer over the first CESL;
planarizing the first ILD layer and first CESL to expose the gate structure;
depositing a second CESL over the first CESL and gate structure;
patterning the second CESL to remove a portion of the second CESL over a portion of the S/D regions;
depositing a second ILD layer over the first ILD layer and second CESL; and
forming a gate contact, a source contact and a drain contact extending through the second ILD layer, wherein a first edge of the second CESL that is proximate the source contact is spaced apart from the source contact by a first distance in a direction substantially parallel to the major surface of the substrate, wherein the first distance is 1 nm to 10 nm, and a second edge of the second CESL that is proximate to the drain contact is spaced apart from the drain contact by a second distance in a direction substantially parallel to the major surface of the substrate, wherein the second distance is 1 nm to 10 nm, wherein a ratio of the first distance to the second distance is between 0.5 and 1.5.

21. The method of claim 20, wherein a width of the second CESL is greater than or equal to a width of the gate structure.

22. The method of claim 20, wherein a thickness of the first CESL is less than a thickness of the second CESL.

23. The method of claim 20, wherein a ratio of a thickness of the second CESL to a thickness of the first CESL is from about 1.05 to about 1.15.

24. The method of claim 20, further comprising forming a germanide region on the source and drain regions.

25. The method of claim 24, wherein the germanide region comprises one of NiGe, PtGe, $TiGe_2$, $CoGe_2$, or PdGe.

* * * * *